(12) United States Patent
Becker et al.

(10) Patent No.: US 10,725,072 B2
(45) Date of Patent: Jul. 28, 2020

(54) SENSOR ASSEMBLY FOR A CURRENT SENSOR, CURRENT SENSOR WITH SUCH A SENSOR ASSEMBLY, HOLDER FOR SUCH A CURRENT SENSOR, AND METHOD FOR ASSEMBLING A CURRENT SENSOR

(71) Applicant: Harting Electric GmbH & Co. KG, Espelkamp (DE)

(72) Inventors: Alexander Becker, Leopoldshoehe (DE); Matthias Wesemann, Warmsen (DE); Jan Drescher, Apelern (DE)

(73) Assignee: HARTING Electric GmbH & Co. KG, Espelkamp (DE)

( * ) Notice: Subject to any disclaimer, the term of this patent is extended or adjusted under 35 U.S.C. 154(b) by 156 days.

(21) Appl. No.: 15/768,406

(22) PCT Filed: Oct. 7, 2016

(86) PCT No.: PCT/EP2016/073993
§ 371 (c)(1),
(2) Date: Apr. 13, 2018

(87) PCT Pub. No.: WO2017/063947
PCT Pub. Date: Apr. 20, 2017

(65) Prior Publication Data
US 2018/0306841 A1    Oct. 25, 2018

(30) Foreign Application Priority Data

Oct. 16, 2015   (DE) .......................... 10 2015 117 651

(51) Int. Cl.
*G01R 15/20*    (2006.01)
*G01R 15/18*    (2006.01)
(Continued)

(52) U.S. Cl.
CPC ........... *G01R 15/202* (2013.01); *G01R 15/18* (2013.01); *G01R 15/183* (2013.01);
(Continued)

(58) Field of Classification Search
None
See application file for complete search history.

(56) References Cited

U.S. PATENT DOCUMENTS

2003/0227285 A1*  12/2003  Marasch .............. G01R 15/202
                                                 324/117 R
2006/0043960 A1*   3/2006  Itoh ...................... G01R 15/185
                                                 324/117 R
(Continued)

FOREIGN PATENT DOCUMENTS

DE    10 2007 035 184 A1    2/2009
DE    11 2012 002 863 T5    4/2014
(Continued)

OTHER PUBLICATIONS

German Office Action, dated Jul. 7, 2016, for German Application No. 10 2015 117 651.3, 7 pages. (with English Translation).
(Continued)

*Primary Examiner* — Jas A Sanghera
(74) *Attorney, Agent, or Firm* — Seed IP Law Group LLP

(57) ABSTRACT

A sensor assembly for a current sensor is provided having a Hall element and a holder for the Hall element, the holder being rigid and including a retainer for the Hall element, in which it is received with small tolerances, and two contact surfaces for a magnetic core. A current sensor having such a sensor assembly and a magnetic core is also provided which has at least one gap in which the holder is arranged, so that the Hall element extends perpendicularly to a direction in which magnetic field lines pass through the gap. A holder for such a current sensor is also provided wherein it consists of a mechanically hard, non-magnetic material, preferably hard plastics or acrylic glass. Lastly, a method of assembling a current sensor is also provided.

11 Claims, 4 Drawing Sheets

(51) Int. Cl.
*G01R 19/00* (2006.01)
*G01R 33/07* (2006.01)

(52) U.S. Cl.
CPC ....... *G01R 15/207* (2013.01); *G01R 19/0092* (2013.01); *G01R 33/072* (2013.01)

(56) References Cited

U.S. PATENT DOCUMENTS

| | | | |
|---|---|---|---|
| 2009/0039880 A1* | 2/2009 | Nomura | G01R 15/202 324/252 |
| 2013/0119975 A1* | 5/2013 | Nakajima | G01R 15/202 324/117 R |
| 2013/0293226 A1 | 11/2013 | Onuma et al. | |
| 2014/0167750 A1 | 6/2014 | Akieda et al. | |
| 2014/0225593 A1 | 8/2014 | Nakajima et al. | |

FOREIGN PATENT DOCUMENTS

| | | |
|---|---|---|
| EP | 1 965 217 A1 | 9/2008 |
| EP | 2 224 461 A1 | 9/2010 |
| EP | 2 835 655 A1 | 2/2015 |
| KR | 10 2006 0050942 A | 5/2006 |
| WO | 2015/140129 A1 | 9/2015 |

OTHER PUBLICATIONS

International Preliminary Report on Patentability, dated Apr. 17, 2018, for International Application No. PCT/EP2016/073993, 7 pages.
International Written Opinion, dated Mar. 5, 2018, for International Application No. PCT/EP2016/073993, 5 pages. (English Translation).
International Search Report and Written Opinion, dated Jan. 17, 2017, for International Application No. PCT/EP2016/073993, 11 pages (with English translation of search report).

* cited by examiner

SENSOR ASSEMBLY FOR A CURRENT SENSOR, CURRENT SENSOR WITH SUCH A SENSOR ASSEMBLY, HOLDER FOR SUCH A CURRENT SENSOR, AND METHOD FOR ASSEMBLING A CURRENT SENSOR

BACKGROUND

Technical Field

This disclosure relates to a sensor assembly for a current sensor. The disclosure further relates to such a current sensor, a holder for such a current sensor, and a method of assembling a current sensor.

The current sensor according to embodiments of the invention is a so-called open loop sensor which has a ring-shaped magnetic core through which a current-carrying element (a busbar, for example) extends. A current flowing through the current-carrying element generates a magnetic field that is concentrated in the magnetic core.

The magnetic core is provided with at least one gap in which a Hall element is arranged which can be used for measuring the strength of the magnetic field in the gap between the two opposite end faces of the magnetic core. Since the strength of the magnetic field depends on the magnitude of the current flowing through the current conducting element, the output signal of the Hall element is indicative of the magnitude of the current flowing through the current conducting element.

The accuracy with which the magnitude of the current flowing through the current conducting element can be inferred from the strength of the magnetic field in the gap of the magnetic core is decisively influenced, among various other factors, by two geometric quantities: the width of the gap and the alignment of the Hall element. Changes in the width of the gap lead to a considerable change in the strength of the magnetic field in the gap. An oblique position of the Hall element in the gap affects the strength of the magnetic field perceived by the Hall element.

Description of the Related Art

There is a variety of approaches in the prior art to increase the measuring accuracy of a current sensor of the aforementioned type.

EP 2 224 461 A1 discloses a magnetic core for a current sensor in which a bridging element is used, which is welded to the magnetic core on both sides of the slot. In this way, any deformations of the magnetic core and resultant changes in the width of the slot are to be prevented.

EP 1 965 217 A1 discloses a current sensor in which the magnetic core is fixed in place in a housing. A circuit board with the Hall element is also fixed in place in the housing, so that the position of the Hall element relative to the slot is predefined.

WO 2015/140129 A1 discloses a current sensor in which the circuit board to which the Hall element is attached is provided with a spring element extending into the slot between the two end faces of the magnetic core and resting against these end faces. This is intended to allow the circuit board with the Hall element attached to it to be used for different magnetic cores.

BRIEF SUMMARY

Embodiments of the present invention provide a high measuring accuracy with little effort.

According to embodiments of the invention, a sensor assembly for a current sensor is provided which includes a Hall element and a holder for the Hall element, the holder being rigid and including a retainer for the Hall element, in which it is received with small tolerances, and two contact surfaces for a magnetic core. According to further embodiments, a current sensor including such a sensor assembly is also provided, having a multipart magnetic core, the holder being arranged in the gap between two respective magnetic core parts such that the Hall element extends perpendicularly to a direction in which magnetic field lines pass through the gap. According to further embodiments, further provided is a holder for such a current sensor, the holder consisting of a mechanically hard, non-magnetic material, preferably hard plastics or acrylic glass.

Embodiments of the invention utilize a rigid holder which has a dual function: For one thing, it serves as a spacer between the opposing end faces which define the gap in the magnetic core. Together with a tape and/or a potting compound and/or other formations that hold the multipart magnetic core together, the rigid holder defines the gap between the individual magnetic core parts in a force-locking manner. By pressing the end faces of the magnetic core against the contact surfaces of the holder, it is ensured with the smallest of effort that the gap in the magnetic core has a predefined width. This width merely depends on tolerances in the manufacture of the holder and also on thermal expansion of the holder due to different operating temperatures of the current sensor. It is, however, possible with very little effort to keep the tolerances below a fraction of a millimeter, in particular smaller than 0.1 mm. For another thing, the holder serves to fix the Hall element in place such that the latter extends perpendicularly to the direction of the magnetic field lines that pass through the gap of the magnetic core when a magnetic field is induced therein. In order to fix the Hall element in place mechanically, the holder has a retainer into which the Hall element can simply be inserted. It is sufficient here if the width of the retainer is slightly larger than the thickness of the Hall element; if desired, the Hall element may also be arranged in the retainer (almost) free of play.

According to a particularly advantageous configuration of the invention, an electronic circuit is provided for amplifying the signals of the Hall element. Such a circuit can be integrated into the circuit board to which the Hall element is also mounted. This results in small dimensions.

Preferably, provision is made that the retainer in the holder extends parallel to the contact surfaces. This automatically ensures that the Hall element extends with the desired alignment in relation to the end faces of the gap of the magnetic core.

According to one configuration of the invention, it is provided that the magnetic core has two or more continuous gaps, so that the magnetic core has a multipart configuration. Each of these gaps has a respective holder with a Hall element arranged therein. In other words, the magnetic core parts are connected to each other mechanically by way of the holders, in particular in a form-locking and/or force-locking manner. Using a plurality of Hall sensors in this way increases the detection accuracy of the current sensor. If three or more gaps and, thus, Hall elements are used, an automatic compensation of the signal received can be obtained, so that the current sensor reacts less sensitively to an eccentric arrangement of the busbar in the interior of the current sensor. At the same time, in this way the respective gap width is defined exclusively by the respective holder. If the shape of the holder remains constant over a specified temperature range or changes only slightly, the same automatically applies to the gap width.

According to one configuration of the invention, a housing is provided, the holder being configured in one piece with the housing. In this configuration, the holder is automatically positioned correctly within the housing so that its contact surfaces may serve for the end faces of the magnetic core to rest against them.

According to an alternative configuration, a housing is provided which has a positioning formation for the holder, the position of the holder relative to the housing being fixed by way of the positioning formation. This embodiment has the advantage that the holder can be produced from a different material than the housing. In addition, this design has the advantage in terms of manufacturing engineering that the magnetic core can initially be joined to the holders separately, in particular provisionally, for example adhesively and/or by wrapping the arrangement consisting of magnetic core parts and holders arranged in a form-locking manner in between with, e.g., an elastic adhesive tape. Subsequently, this arrangement may be introduced into the housing and brought to the desired position there and potted with a potting compound. The correct positioning of the arrangement can be facilitated in that the housing has at least one first positioning means or device and each holder has at least one second positioning means or device, which cooperates with the at least one first positioning means or device of the housing. In particular, the first positioning means or device may consist of a web and the second positioning means or device may consist of a second slot of the holder. The positioning formation ensures that the holder is precisely positioned at the desired place in the housing.

Preferably, the holder is provided with a groove (the second slot mentioned above) in which the positioning formation engages. This allows the holder to be positioned relative to the housing with little effort and without requiring a time-consuming assembly.

The groove is preferably oriented oppositely to the retainer here. This makes the assembly process easier because the positioning formation and the Hall sensor will not "get in each other's way."

Preferably, in a top view, the holder has the shape of an H. The holder may therefore be produced in an original molding process with little effort, e.g., it may be injection molded.

According to a particularly advantageous embodiment, it is provided that the retainer is open toward the side facing away from the center of a space enclosed by the magnetic core. This allows the Hall sensor together with the circuit carrying it to be mounted "from outside," that is, from a side on which the available space is least limited.

In some instances, the holder consists of a mechanically hard, non-magnetic material, for example hard plastics or acrylic glass. But other materials are also conceivable which can be used for precisely aligning the Hall element and precisely defining the distance between the end faces of the magnetic core. In particular in comparison with technical solutions in which the Hall element, which is initially free-standing in the gap during the manufacturing process, is embedded in the potting compound by subsequent potting and is fixed in its final position in the gap exclusively thereby after curing of the potting compound, the solution according to embodiments of the invention distinguishes itself by a much higher precision and stability, in particular also over a long period of time, that is, e.g., also over several years. The holder according to embodiments of the invention does not shrink, does not flow and does not work, as is usually the case with potting compounds after some time.

According to one configuration of the invention, provision is made that the retainer is an incision, which is optionally provided with an insertion bevel. It has been found that a configuration of such geometrical simplicity as an incision is sufficient to position the Hall element in the gap of the magnetic core with sufficient precision. Insertion of the Hall element into the incision can be facilitated by way of the optionally provided insertion bevel.

According to embodiments of the invention, provision is also made for a method of assembling a current sensor, the current sensor including a magnetic core provided with a gap. According to embodiments of the invention, first a holder is arranged between two opposite end faces of the gap of the magnetic core, the holder being provided with a retainer for a Hall element. Subsequently, a circuit board with a Hall element fitted thereto is mounted in such a manner that the Hall element is inserted into the retainer at least almost without clearance. The method according to embodiments of the invention distinguishes itself in that a very high protection from error is automatically obtained to the effect that a non-correct positioning of the Hall element can be detected with little effort. Since the retainer for the Hall element is only slightly wider than the thickness of the Hall element, the Hall element can only be inserted into the retainer if and when it is positioned correctly, that is, when it extends perpendicularly to the direction of the magnetic field lines in the gap. If, however, the Hall element is mounted to the circuit board at an angle or the circuit board is not correctly aligned during assembly, the Hall element cannot enter the retainer. Therefore, when an attempt is made to move the circuit board to the correct position, the Hall element will be destroyed, so that during a final inspection it will be obvious immediately whether the Hall element is arranged in the retainer correctly (i.e., in the only possible orientation) or not at all.

Advantages of embodiments of the invention reside in that using a component that is cost-effective to manufacture, i.e., the holder, a large number of functions can be fulfilled:

the width of the gap between neighboring magnetic core parts is fixed with minimum effort and very small tolerances;

the Hall element is positioned in the gap with minimum effort;

the magnetic core parts can be positioned relative to the housing by way of the holder;

the final inspection is simplified, so that the risk of faulty current sensors being delivered is reduced.

These advantages are greater the larger the number of holders installed in a sensor.

The final inspection is simplified in particular because after mounting the Hall element, it can be checked on the basis of a simple yes/no evaluation using the electrical function of the current sensor whether the Hall element has been inserted into the retainer or is outside the retainer. If the Hall element is within the retainer, the current sensor will work as intended. If the Hall element is outside the retainer, the current sensor will not work at all. This is an advantage in particular over other designs in which the Hall sensor is merely potted and a slight malposition has an effect on the measuring accuracy purely in terms of quality. After potting, the actual position of the Hall element within the potting compound can no longer be checked (or, at best, with extremely great effort, such as, for example, by X-ray technology). According to embodiments of the invention, on the other hand, it can be determined very quickly whether the Hall element is installed correctly: it is either positioned inside the retainer, or it is outside the retainer in a bent or folded-over state, which can be easily and definitely detected during final inspection by checking the electrical function of the current sensor and, thus, the electrical function of the Hall element. More precisely, if there is no appropriate signal of the Hall element in spite of a current passing through the magnetic core, the current sensor is to be identified—according to embodiments of the invention—as being clearly defective. In contrast to this, in the case of only slight misalignments of the Hall element as are possible in the prior art, it would be far more difficult to make such a quality-assuring distinction, for example by using a reference sensor considered to be perfect.

BRIEF DESCRIPTION OF THE SEVERAL VIEWS OF THE DRAWINGS

Aspects of the invention will be described below with reference to embodiments which are illustrated in the accompanying drawings, in which.

DETAILED DESCRIPTION

Figure 1:
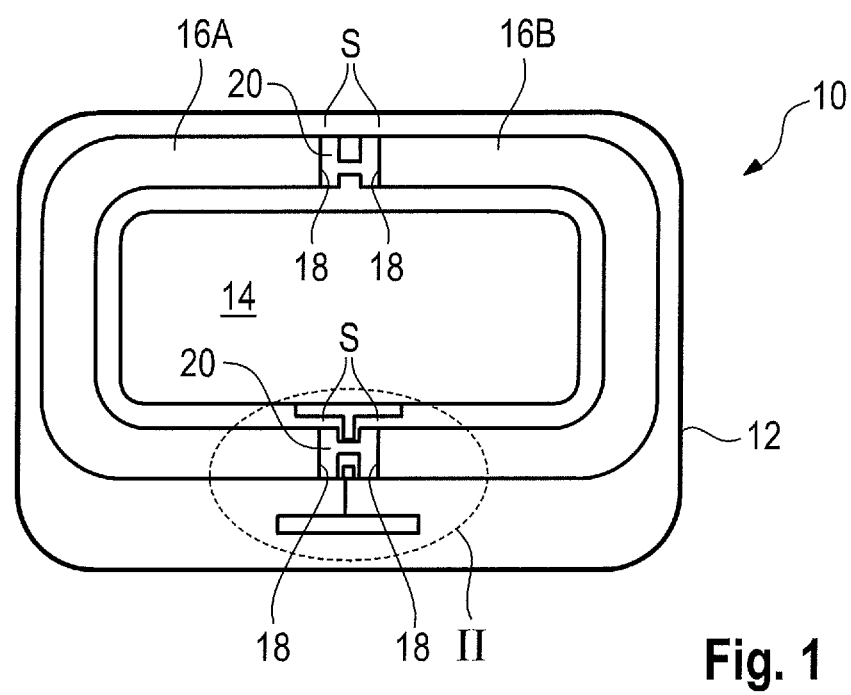
FIG. 1 shows a top view of a current sensor according to an embodiment of the invention.

FIG. 1 schematically shows a current sensor 10 which has a housing 12. The housing 12 encloses an interior 14 through which a current-carrying element, for example a busbar, may extend.

A multipart magnetic core is arranged inside the housing such that it encloses the interior 14. In the exemplary embodiment shown, the magnetic core consists of two magnetic core halves 16A, 16B, which are arranged such that a gap S exists between their opposing end faces 18.

A holder 20, which is shown in detail in FIGS. 3 and 4a-4c, is arranged between the end faces 18 in each gap S.

The holder 20 has a cuboid basic shape. Two outer surfaces facing away from each other constitute contact surfaces 22, which extend parallel to each other and are provided for the end faces 18 defining the gap S of the magnetic core to rest against them.

Figure 4A:
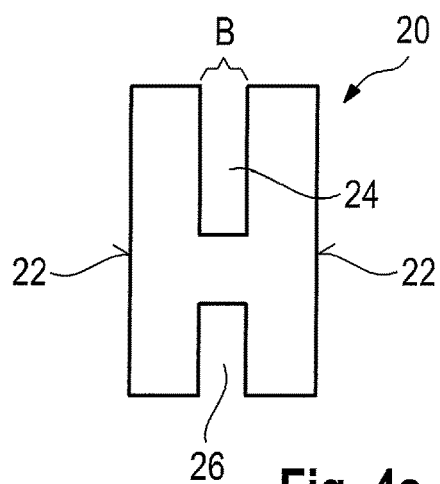
FIGS. 4a to 4c show the holder of FIG. 3 in a top view, a first side view and a second side view.
Figure 4B:
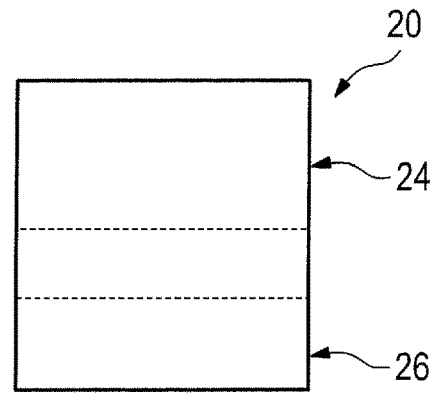
Figure 4C:
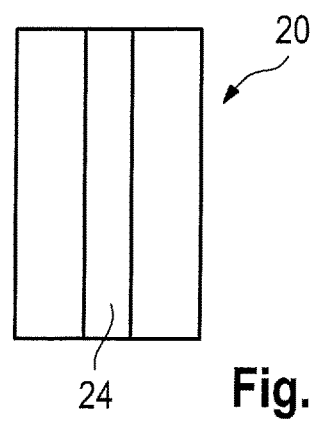

Starting from a further outer surface of the holder 20, a retainer 24 for a Hall element extends. The retainer 24 here is in the form of a straight, continuous incision having a constant width B, the incision extending parallel to the contact surfaces 22, as shown in FIGS. 4a-4c.

The retainer 24 is open to the side facing away from the interior 14, that is, on the side of the outer circumference of the magnetic core halves 16A, 16B.

A groove 26 is provided on the side of the holder 20 facing away from the retainer 24 and also extends parallel to the contact surfaces 22. As a result, the holder 20 is H-shaped in a top view (see FIG. 4a).

Thus, the groove 26 faces the center of the space enclosed by the magnetic core halves 16A, 16B (the interior 14) and, therefore, is oriented oppositely to the retainer 24.

Deviating from the exemplary embodiment shown, different widths may be used for the retainer 24 and the groove 26. Also, depending on requirements in individual cases, the depths of the retainer 24 and the groove 26 may be selected to be different from those shown in the drawings.

The material used for the holder 20 is a mechanically hard, non-magnetic material. Hard plastics or acrylic glass is especially suitable here. The general demand on the material used is that it will not deform when subjected to loads. Furthermore, it should have as low a coefficient of thermal expansion as possible.

Preferably, the holder 20 is produced using a mold, for example injection molded. This allows the holder 20 to be produced with very high precision and shape accuracy.

Figure 2:
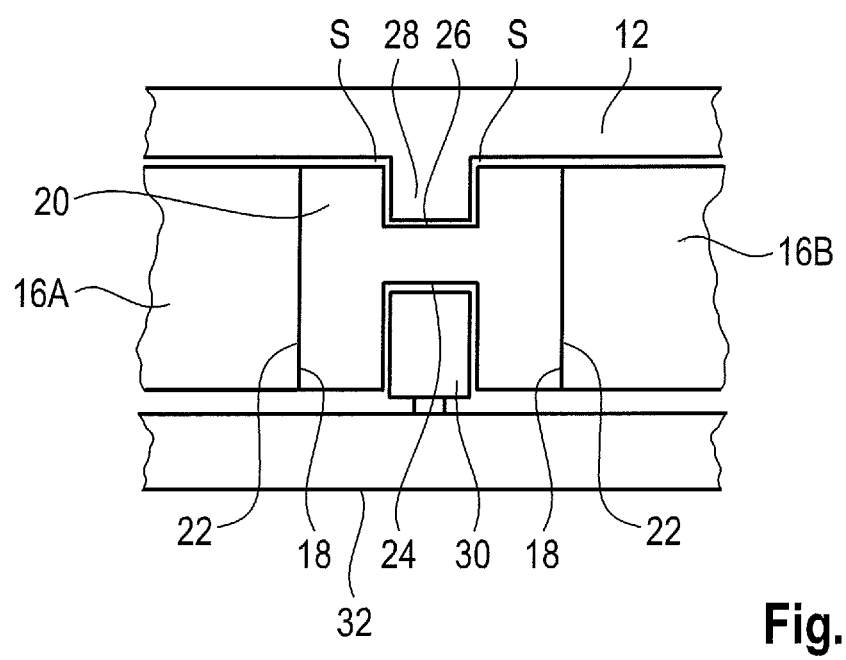
FIG. 2 shows the detail II of FIG. 1 on an enlarged scale.
Figure 3:
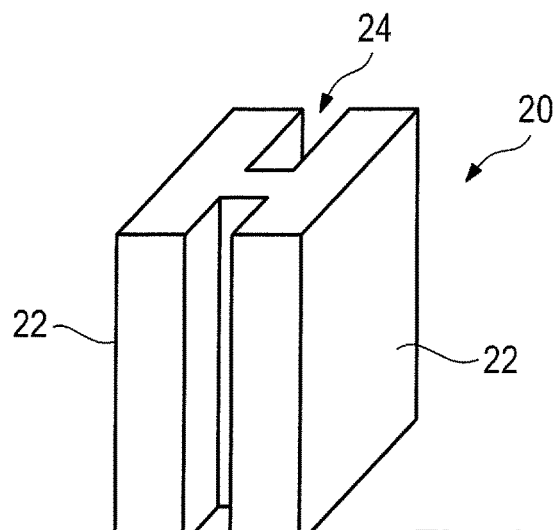
FIG. 3 shows a perspective view of a holder used in the current sensor of FIG. 1.

As can be seen in particular in FIG. 2, the end faces 18 defining the gap S are in surface contact with the contact surfaces 22 of the holder 20. Since the holder 20 is made from a mechanically hard material, it defines the width of the gap S between the end faces 18 very precisely. In a first embodiment, the housing 12 is preferably configured such that the magnetic core parts 16A, 16B arranged in it are mechanically urged against the contact surfaces 22 of the respective holder 20 and in this way fix the holder 20 in place in the gap S in a force-locking manner.

In a different embodiment, the magnetic cores 16A, 16B are at first arranged outside the housing 12 so as to face each other, the holders 20 being positioned between their end faces 18. The holders 20 are held between the magnetic core parts 16A, 16B in a force-locking manner by a provisional force-locking fixing, e.g., by wrapping the magnetic core with an elastic adhesive tape. Alternatively, the holders 20 could also be adhesively connected at the end faces, for example. Then the arrangement made up of the magnetic core parts 16A, 16B and the two holders 20 can be introduced into the housing 12.

The grooves 26 of the holders 20 serve to position the holders in the housing 12. For this purpose, the housing 12 is provided with a positioning formation 28, which here is in the form of a web that is complementary to the groove 26. Positioning the holders will automatically position the arrangement made up of the magnetic core parts 16A, 16B and the holders 20 in the dedicated position in the housing 12.

According to an alternative embodiment, which is not shown, provision may also basically be made that the holder 20 is formed in one piece with the housing 12. In this case, rather than the design made up of the groove 26 and the positioning formation 28, an integral material connection is provided.

The retainer 24 serves to receive a Hall element 30, which is mounted to a circuit board 32. An electronic circuit which is used for amplifying the output signal of the Hall element 30, for example, may also be mounted on the circuit board 32, as shown in FIG. 2.

The dimensions of the Hall element 30 and of the retainer 24 are adapted to each other. More specifically, the width B of the retainer 24 corresponds to the thickness of the Hall element 30, or the width B is slightly larger than the thickness of the Hall element 30. The width B of the retainer 24 is selected here such that, on the one hand, the Hall element 30 can be inserted into the retainer 24 in the longitudinal direction thereof and, on the other hand, the retainer 24 predefines the orientation of the Hall element 30. In particular, the retainer 24 ensures that the Hall element 30 extends parallel to the contact surfaces 22 and the end faces 18 and, therefore, perpendicularly to the direction of magnetic field lines which pass through the gap S when a current flows through a current-carrying element extending through the interior 14.

For greater clarity, the Figures show the holder 20 as being rotated through 90 degrees about an axis extending in the direction of the magnetic field lines, with the retainer 24 being open toward that side which faces away from the center of a space enclosed by the magnetic core. In practice, the retainer 24 is "at the top" (related to FIGS. 1 and 2), so that the circuit board 32 would cover the retainer 24 in the Figures and the retainer 24 would not be visible. In the latter case, the retainer is open to that side which faces away from a rear side of the housing 12.

Figure 5:
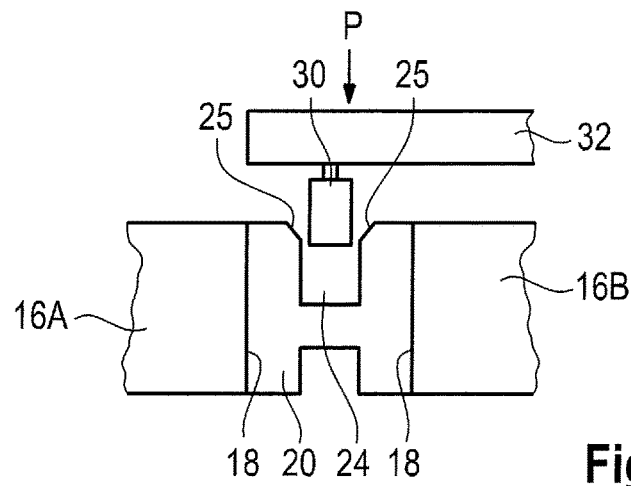
FIG. 5 shows a schematic illustration of a first step in mounting a sensor assembly to the current sensor.
Figure 6:
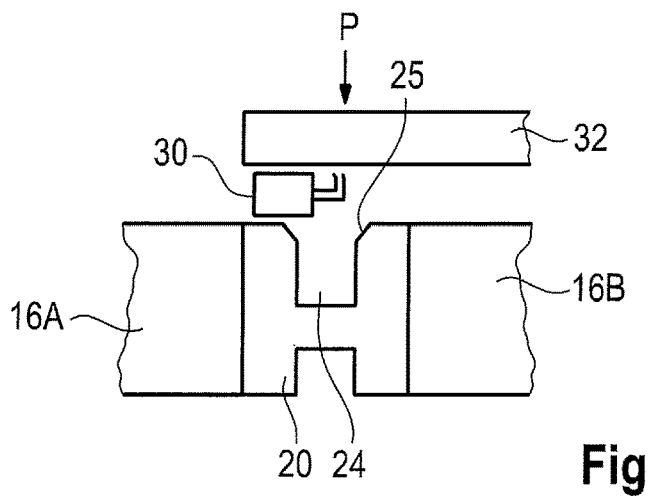
FIG. 6 shows the current sensor after an unsuccessful attempt to insert the Hall element into the holder.
Figure 7:
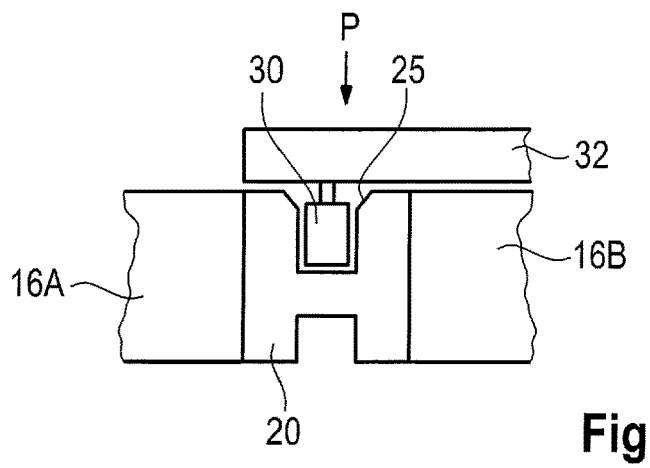
FIG. 7 shows the current sensor with the Hall element inserted correctly.

Referring to FIGS. 5 to 7, the assembly of the current sensor 10 will be discussed below.

In a first step, the holder 20 is arranged between the end faces 18, with the magnetic core parts 16A, 16B being urged against the holder 20 such that the holder 20 precisely determines the width of the gap S.

Then the circuit board 32 with the Hall element 30 mounted thereto is provided. The Hall element 30 projects substantially perpendicularly from the surface of the circuit board 32.

In order to mount the circuit board 32 to the current sensor, it is shifted in the direction of the arrow P such that the Hall element 30 is inserted into the retainer 24. In practice, the direction P is oriented parallel to the direction of extent of a busbar extending through the interior 14 of the current sensor 10.

If the Hall element 30 is fitted to the circuit board 32 in a non-correctly aligned state, or if the circuit board 32 is not correctly positioned relative to the holder 20, or if there is some other misalignment, the Hall element 30 will not move into the retainer 24 when the circuit board 32 is shifted in the direction of the arrow P. This ensures that the Hall element 30 will be destroyed during the faulty assembly (see FIG. 6, which shows a bent-over Hall element 30 for clarification). This state can be reliably detected with little effort in a subsequent check or else during a final inspection of the current sensor by testing the electrical function of the current sensor 10.

If, in contrast, the Hall element 30 is correctly aligned in relation to the retainer 24, it is inserted into the holder 20 without difficulty (see FIG. 7). Here, the retainer 24 ensures that the Hall element 30 is correctly oriented or aligned within the gap S.

If desired, insertion of the Hall element 30 into the retainer 24 of the holder can be facilitated in that a respective insertion bevel 25 (see in particular FIG. 5) is provided at the edge of the retainer 24.

Once the Hall element 30 has been inserted into the holder 20, the arrangement consisting of the magnetic core parts 16A, 16B, the holders 20 positioned in between, and the Hall elements 30 inserted therein may be potted in the housing 12 with a potting compound.

Figure 8:
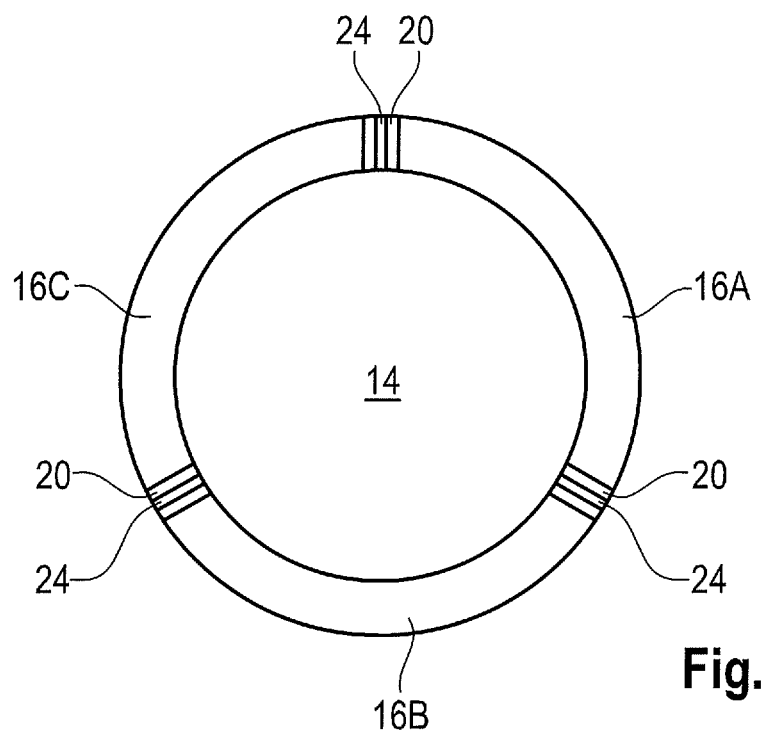
FIG. 8 schematically shows a magnetic core with holders for a current sensor according to a further embodiment of the invention.

FIG. 8 schematically shows the magnetic core with holders 20 for a current sensor according to a further embodiment. The same reference numbers will be used for the components known from the preceding embodiment, and reference is made to the above discussions in this respect.

The difference between the embodiment according to FIG. 8 and the first embodiment resides in that the magnetic core is circular here and a total of three gaps S are provided. Accordingly, there are three magnetic core parts 16A, 16B, 16C, each extending over an angular range of almost 120 degrees. Arranged in each of the gaps S is a holder 20, which has a Hall element 30 mounted to it (not shown here).

The advantage of this embodiment is that the current sensor 10 reacts less sensitively to an eccentric arrangement of the busbar in the interior 14. If the busbar is arranged eccentrically and is therefore arranged further away from a Hall element 30, it is automatically arranged closer to at least one of the other two Hall elements 30. This results in an automatic compensation of the signal measured in total for the current intensity.

Figure 9:
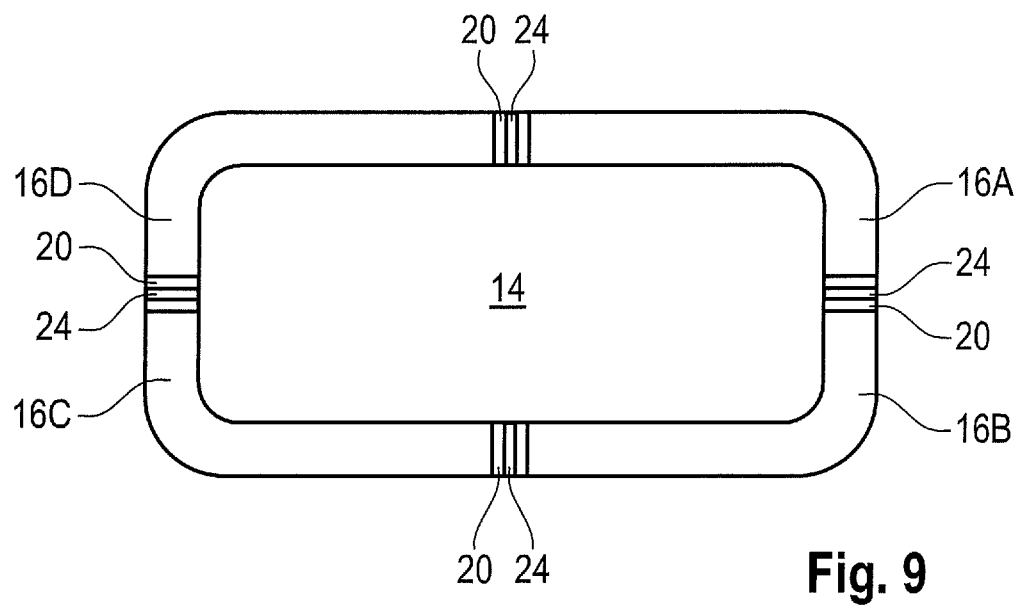
FIG. 9 schematically shows a magnetic core with holders for a current sensor according to yet another embodiment of the invention.

FIG. 9 schematically shows the magnetic core with holders for a current sensor according to yet another embodiment. The same reference numbers will be used for the components known from the preceding embodiments, and reference is made to the above discussions in this respect.

The difference between the embodiment according to FIG. 9 and the embodiment described with reference to FIG. 1 resides in that the magnetic core provided here has a total of four gaps S, more specifically one respective gap on each straight side of the generally rectangular magnetic core. Accordingly, the magnetic core is made up of four magnetic core parts 16A to 16D, each having a radius section extending over 90 degrees and a long and a short leg adjoining it. Here, too, each gap S has a holder 20 arranged therein, which has a Hall element 30 mounted to it (not shown here).

In the embodiment shown in FIG. 9, the advantage arises that the current sensor reacts less sensitively to an eccentric arrangement of the busbar in the interior 14. If the busbar is arranged eccentrically and is therefore further away from a Hall element 30, it is automatically arranged closer to at least one of the other three Hall elements 30, as a result of which the magnetic field measured in total in the four gaps S remains (at least approximately) constant.

In general, in the following claims, the terms used should not be construed to limit the claims to the specific embodiments disclosed in the specification and the claims, but should be construed to include all possible embodiments along with the full scope of equivalents to which such claims are entitled.

The invention claimed is:

1. A current sensor, comprising:
   a housing having positioning formations;
   a multipart magnetic core having magnetic core parts;
   a plurality of Hall elements; and
   a plurality of holders for the Hall elements, the holders being rigid and each including a retainer for a respective one of the plurality of Hall elements, in which the Hall element is received, each holder further having opposing contact surfaces in contact with the multipart magnetic core, and each holder further having a groove in which a respective one of the positioning formations of the housing is engaged.

2. The current sensor according to claim 1, wherein an electronic circuit is provided for amplifying signals of the Hall elements.

3. The current sensor according to claim 1, wherein the retainer of each holder extends parallel to the contact surfaces.

4. The current sensor according to claim 1, wherein each holder is arranged in a respective gap between the magnetic core parts of the multipart magnetic core and such that the respective Hall element extends perpendicularly to a direction in which magnetic field lines pass through the gap.

5. The current sensor according to claim 4, wherein the magnetic core parts are connected to each other in a force-locking manner by the holders, whereby the multipart magnetic core has at least two gaps each of which has a respective holder fixed in place therein in a force-locking manner, each holder defining a gap width of the gap in which the holder is fixed.

6. The current sensor according to claim 4, wherein the position of each holder relative to the housing is fixed by the positioning formations.

7. The current sensor according to claim 4, wherein the retainer of each holder is open either toward a side which faces away from a center of a space enclosed by the multipart magnetic core, or that the retainer of each holder is open toward a side which faces away from a rear side of the housing.

8. The current sensor according to claim 4, wherein each holder consists of a non-magnetic material.

9. The current sensor according to claim 8, wherein the retainer of each holder is a slot provided with an insertion bevel.

10. The current sensor according to claim 1, wherein the groove of each holder is oriented oppositely to the retainer.

11. The current sensor according to claim 10, wherein in a top view, each holder has a shape of an H.

\* \* \* \* \*